United States Patent
Kuo et al.

(10) Patent No.: US 7,560,812 B2
(45) Date of Patent: Jul. 14, 2009

(54) COOLING MODULE AGAINST ESD AND ELECTRONIC PACKAGE, ASSEMBLY AND SYSTEM USING THE SAME

(75) Inventors: Kevin Kuo, Taipei Hsien (TW); Stanley Huang, Taipei Hsien (TW); Cheng-Ming Hsu, Taipei Hsien (TW); Neng-An Kuo, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 127 days.

(21) Appl. No.: 11/554,046

(22) Filed: Oct. 30, 2006

(65) Prior Publication Data

US 2008/0012123 A1    Jan. 17, 2008

(30) Foreign Application Priority Data

Jul. 17, 2006    (TW)    ............................... 95126013 A

(51) Int. Cl.
*H01L 23/10*    (2006.01)
*H01L 23/34*    (2006.01)

(52) U.S. Cl. .................. 257/707; 257/778; 257/713; 257/660; 257/E23.101

(58) Field of Classification Search .................. 257/707, 257/778, 713, 659, 660, E23.101
See application file for complete search history.

(56) References Cited

U.S. PATENT DOCUMENTS

| | | | |
|---|---|---|---|
| 4,664,309 A * | 5/1987 | Allen et al. ............ | 228/180.22 |
| 5,175,613 A * | 12/1992 | Barker et al. ................. | 257/713 |
| 6,376,907 B1 * | 4/2002 | Takano et al. ............... | 257/704 |
| 6,437,240 B2 * | 8/2002 | Smith .......................... | 174/541 |
| 6,486,534 B1 | 11/2002 | Sridharan et al. | |
| 6,577,504 B1 * | 6/2003 | Lofland et al. .............. | 361/709 |
| 6,778,406 B2 * | 8/2004 | Eldridge et al. ............. | 361/776 |
| 6,829,143 B2 * | 12/2004 | Russell et al. ............... | 361/704 |
| 6,982,481 B1 | 1/2006 | Sonderegger et al. | |
| 2002/0117330 A1 * | 8/2002 | Eldridge et al. ............. | 174/260 |
| 2004/0057212 A1 * | 3/2004 | Russell et al. ............... | 361/704 |

FOREIGN PATENT DOCUMENTS

| CN | 1146273 | 3/1997 |
|---|---|---|
| CN | 1536662 | 10/2004 |
| CN | 1659942 | 8/2005 |

* cited by examiner

*Primary Examiner*—Nitin Parekh
(74) *Attorney, Agent, or Firm*—Jiang Chyun IP Office

(57) ABSTRACT

An electronic assembly includes a substrate, a chip, a conductive fence and a heat sink. The substrate has a bonding surface. The chip is bonded to the bonding surface. The conductive fence connects the bonding surface and at least locally surrounds the sides of the chip. The heat sink is disposed over the substrate and contacts the chip and the conductive fence. By disposing the conductive fence between the substrate and the heat sink, the conductive fence and the heat sink can further function as the shields of the chip to reduce any adverse influence of an ESD current on the chip.

22 Claims, 4 Drawing Sheets

COOLING MODULE AGAINST ESD AND ELECTRONIC PACKAGE, ASSEMBLY AND SYSTEM USING THE SAME

CROSS-REFERENCE TO RELATED APPLICATION

This application claims the priority benefit of Taiwan application serial no. 95126013, filed on Jul. 17, 2006. All disclosure of the Taiwan application is incorporated herein by reference.

BACKGROUND OF THE INVENTION

1. Field of Invention

The present invention relates to an electronic assembly, and more particularly, to an electronic assembly capable of reducing the damage risk of the integrated circuit chip thereof caused by an electrostatic discharge (ESD).

2. Description of the Related Art

Along with the rise of the semiconductor industry, the application of integrated circuit chips (IC chips) has covered almost all the electronic apparatuses. To connect the electrodes of an IC chip and protect the IC chip itself, a packaging process is usually conducted, so that an IC chip takes an electronic package form available for mounting the same on the motherboard of an electronic apparatus.

Among the semiconductor packaging technologies, the flip chip bonding technology is the one to assemble an IC chip on a carrier. In comparison with the traditional wire bonding technology, the flip chip bonding technology is more suitable for an IC chip package application requiring high pin count and high pin density, by which the signal path is significantly shortened.

Additionally, the rigid carrier, as the most common carrier employed by an electronic package, includes a leadframe and a package substrate. A package substrate (a multi-layer wiring board with high wiring density) can provide more contact counts and higher contact density than a leadframe. Therefore, the flip chip bonding technology is preferred to be used for packaging an IC chip with high pin count and high pin density in association with a package substrate.

In addition to packaging an IC chip with high pin count and high pin density, the flip chip bonding technology is able further to make the back of a packaged IC chip exposed out, which facilitates cooling the IC chip, because a heat sink can easily accesses and contacts the back of the IC chip for heat dissipation. To increase the dissipation efficiency, a layer of thermal paste or a thermal pad is disposed between the IC chip and the heat sink.

Since the active surface of an IC chip is very vulnerable, any ESD current, no matter resulted by any cause, can make the IC device of a packaged IC chip assembled in an electronic apparatus a fatal damage. Therefore, any of electronic apparatuses and IC chips must be designed to have ESD robustness.

SUMMARY OF THE INVENTION

The present invention provides an electronic package, which includes a substrate, a chip and a conductive fence. The substrate has a bonding surface. The chip is bounded to the bonding surface. The conductive fence is bounded to the bonding surface and at least locally surrounds the sides of the chip.

The present invention provides a cooling module suitable for being fixed on an electronic package, wherein the electronic package has a substrate having a bonding surface and a chip bonded to the bonding surface. The cooling module includes a heat sink and a conductive fence connected to the heat sink. As the heat sink is disposed over the substrate and contacts the chip, the conductive fence at least locally surrounds the sides of the chip.

The present invention provides an electronic assembly, which includes a substrate, a chip, a conductive fence and a heat sink. The substrate has a bonding surface. The chip is bonded to the bonding surface. The conductive fence is connected to the bonding surface and at least locally surrounds the sides of the chip. The heat sink is disposed over the substrate and contacts the chip and the conductive fence.

The present invention provides an electronic system, which includes a bus, a memory unit and an electronic assembly. The memory unit is electrically connected to the electronic assembly via the bus. The electronic assembly includes a substrate, a chip, a conductive fence and a heat sink. The substrate has a bonding surface. The chip is bonded to the bonding surface. The conductive fence is connected to the bonding surface and at least locally surrounds the sides of the chip. The heat sink is disposed over the substrate and contacts the chip and the conductive fence.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
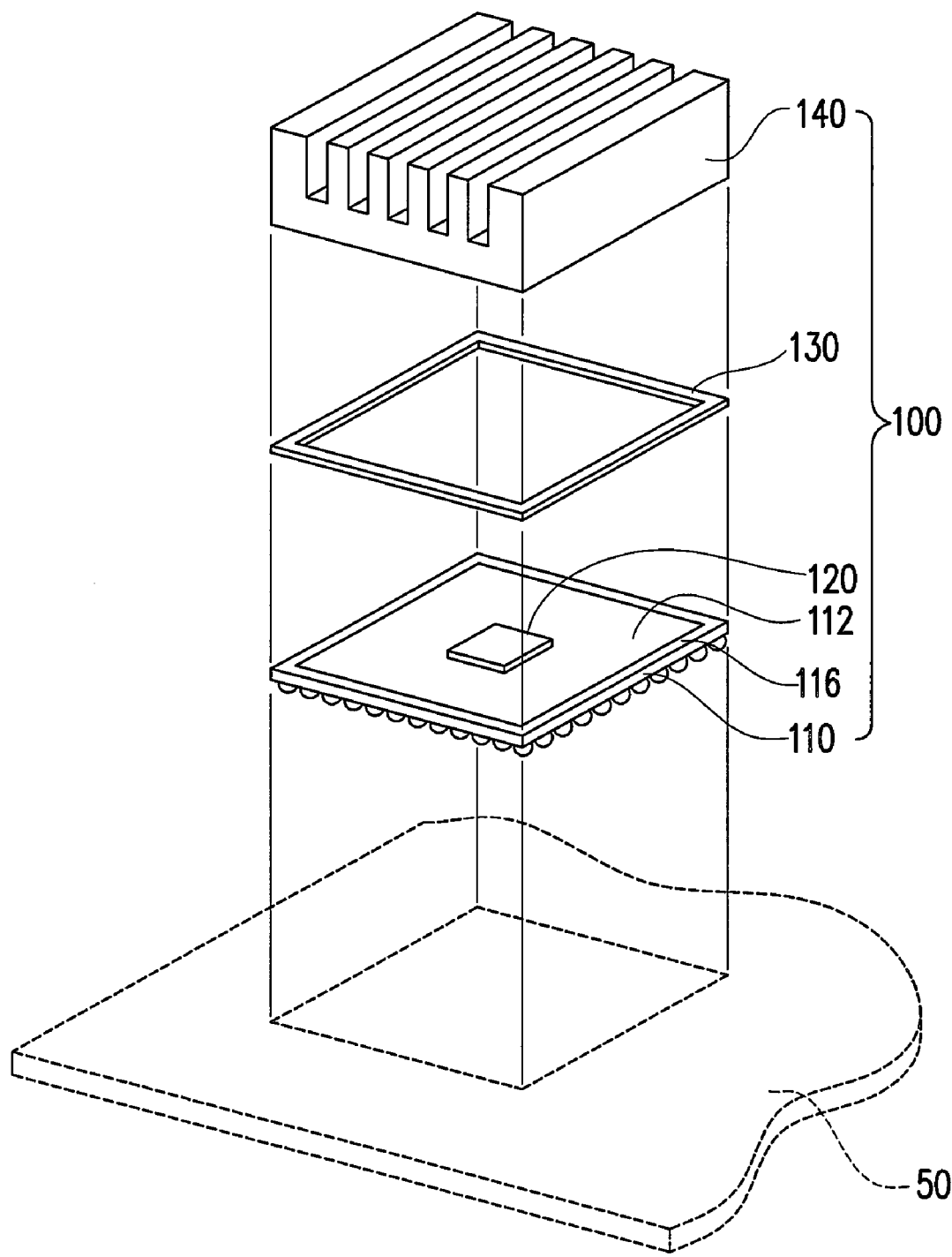
FIG. 1 is an exploded view of an electronic assembly according to an embodiment of the present invention assembled on a circuit board.
Figure 2:
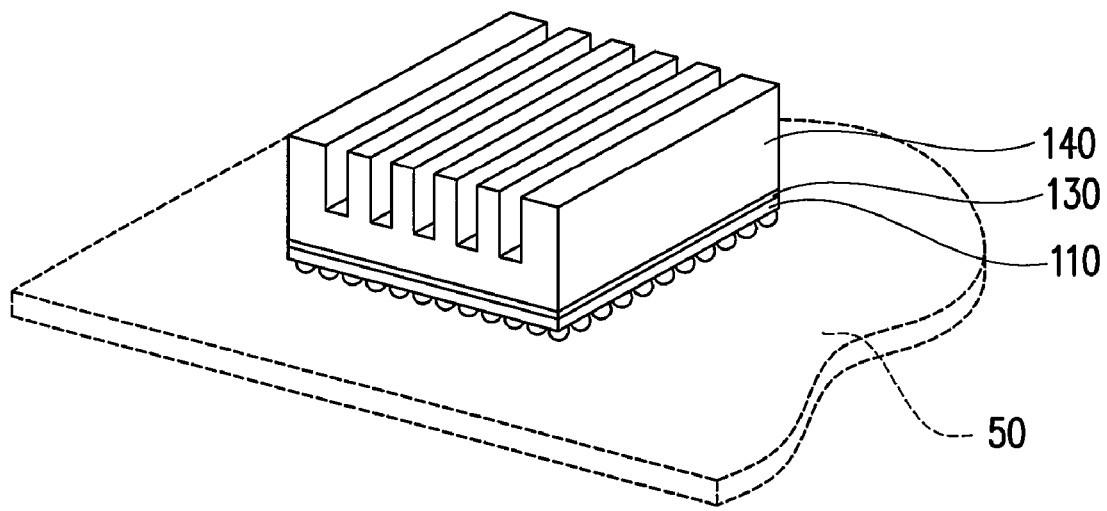
FIG. 2 is an assembled view of the electronic assembly and the circuit board in FIG. 1.
Figure 3:
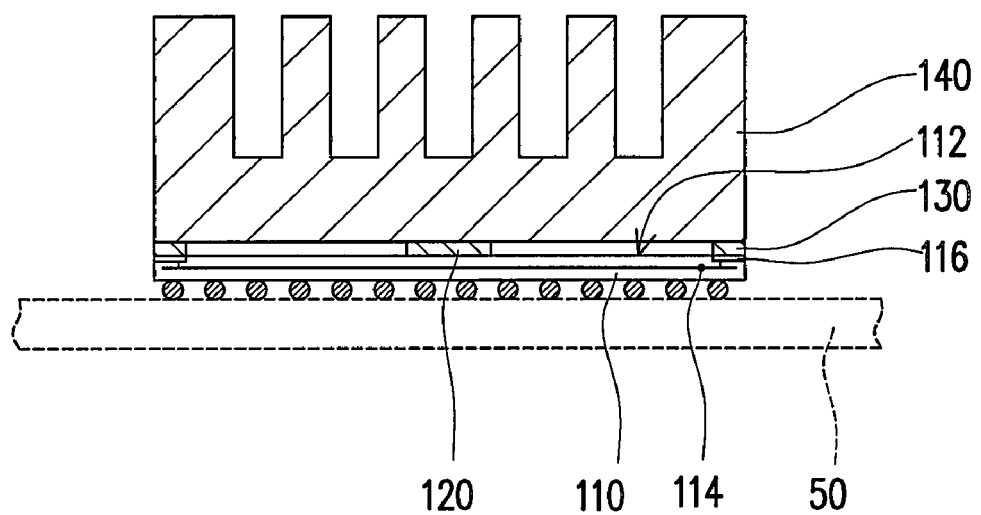
FIG. 3 is a cross-sectional view of the electronic assembly assembled on the circuit board in FIG. 2.

FIG. 1 is an exploded view of an electronic assembly according to an embodiment of the present invention assembled on a circuit board, FIG. 2 is an assembled view of the electronic assembly and the circuit board in FIG. 1, and FIG. 3 is a cross-sectional view of the electronic assembly assembled on the circuit board in FIG. 2. Referring to FIGS. 1-3, an electronic assembly 100 of an embodiment of the present invention includes a substrate 110, a chip 120, a conductive fence 130 and a heat sink 140. The substrate 110, the chip 120 and the conductive fence 130 may form an electronic package, while the conductive fence 130 and the heat sink 140 may form a cooling module.

The substrate 110 is a package substrate for packaging the chip 120, while the chip 120 is bonded to a bonding surface 112 of the substrate 110. In the embodiment, the chip 120 is bonded to the bonding surface 112 of the substrate 110 in flip chip bonding mode; thus, a local part of the chip 120 (for example, the back thereof) can be exposed out. The flip chip bonding between the substrate 110 and the chip 120 is an electrical and structure connection, and may be implemented by using a bump array, an anisotropic conductive film (ACF) or anisotropic conductive paste (ACP).

After the flip chip bonding, a local part of the chip 120 is exposed out, which facilitates the heat sink 140 disposed over the substrate 110 to access and contact the chip 120 for better cooling the chip 120 to get a reduced temperature. Moreover, a layer of thermal paste or a thermal pad (not shown) may be disposed between the chip 120 and the heat sink 140 to further advance the dissipation efficiency of the heat sink 140. In addition to the heat sink 140, a heat pipe and a fan may be optionally added to enhance the cooling capacity of the heat sink 140.

In general, the heat sink 140 is made of metal, for example, copper or aluminum alloy which makes the heat sink 140 electrically conductive. Therefore, in order to directly use the heat sink 140 as the metal shield of the chip 120, the conductive fence 130 is disposed on the bonding surface 120 of the substrate 110 and between the chip 110 and the heat sink 140, so as to make the heat sink 140 conductively contact the conductive fence 130.

Hence, the conductive fence 130 and the heat sink 140 can serve as a metal shield of the chip 120 from the upper direction and the side direction of the chip 120 to block any electromagnetic wave which could harm the operation of the chip 120. In the embodiment, the conductive fence 130 may be non-woven cloth plated with metal on the surfaces thereof. Besides, the compressive deformation rate of the conductive fence 130 in the direction vertical to the bonding surface 112 ranges 5%-15%, i.e. the compressive deformation rate of the thickness of the conductive fence 130 ranges 5%-15%, which helps to avoid an excessive pressure of the heat sink 140 applying to the chip 120.

In the embodiment, the conductive fence 130 continuously surrounds the sides of the chip 120. However, in another embodiment (not shown), the conductive fence 130 intermittently surrounds the sides of the chip 120, where the conductive fence 130 is divided into a number of segments for surrounding the sides of the chip 120 and the gaps or intervals between the adjacent segments must be less than the wavelengths of the harmful electromagnetic waves to block the waves. For example, the gaps or intervals between the adjacent segments may be less than one twentieth of the wavelengths of the harmful electromagnetic waves.

In the embodiment, the conductive fence 130 and the heat sink 140 are individually and separately fabricated. However, in another embodiment, the conductive fence 130 and the heat sink 140 are formed integrally, meanwhile a buffer layer may be disposed between the conductive fence 130 and the substrate 110.

In order to get a better protection effect, the substrate 110 may further have a grounding circuit 114 (referring to FIG. 3), which is, for example, a grounding plane, while the conductive fence 130 is electrically connected to the grounding circuit 114. In this way, an ESD current, which originally may flow through the gap between the substrate 110 and the heat sink 140 to arrive at the chip 120, would be blocked by the conductive fence 130 disposed between the substrate 110 and the heat sink 140, and detoured to flow through the grounding circuit 114 of the substrate 110. Thus, the adverse influence on the chip 120 caused by an ESD current is reduced.

To electrically connect the conductive fence 130 to the grounding circuit 114 of the substrate 110, the substrate 110 is further equipped with a grounding trace 116 disposed on the bonding surface 112. In this way, the conductive fence 130 is able to connect or contact the grounding trace 116, which is further electrically connected to the grounding circuit 114 of the substrate 110. In addition, the conductive fence 130 and the grounding trace 116 are connected to each other by soldering or by using conductive paste.

In the embodiment, the grounding trace 116 is continuously extended onto the bonding surface 112 of the substrate 110. However, in another embodiment (not shown), the grounding trace 116 is intermittently distributed on the bonding surface 112 of the substrate 110, i.e. the grounding trace 116 is divided into a number of segments distributed on the bonding surface 112 of the substrate 110.

Figure 4:
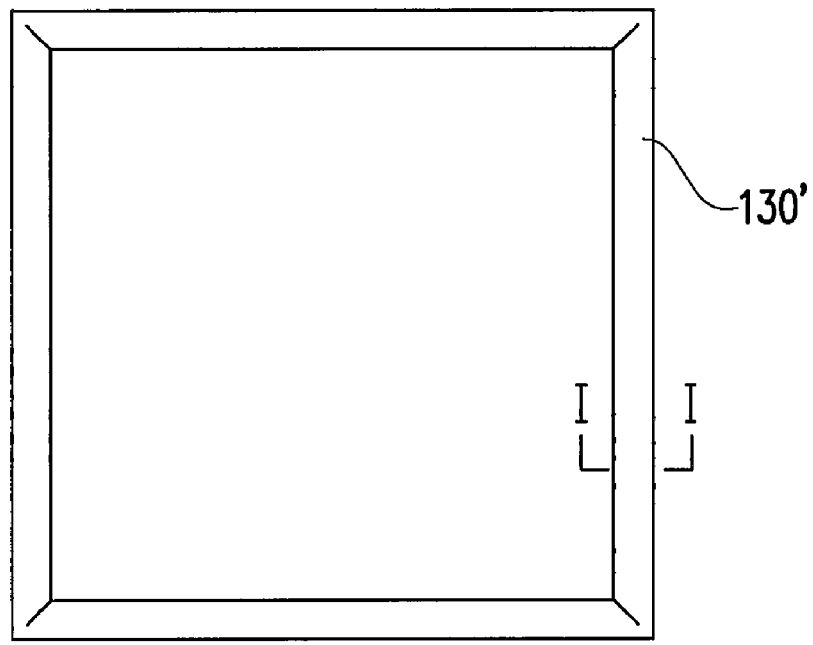
FIG. 4 is a top view of a conductive fence according to another embodiment of the present invention.
Figure 5A:
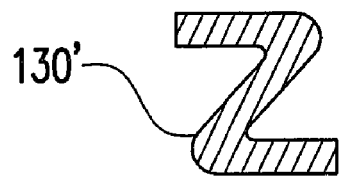
FIG. 5A is a cross-sectional view of the conductive fence along line I-I in FIG. 4.
Figure 5B:
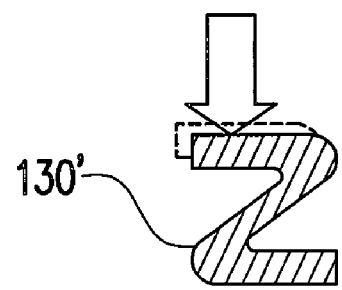
FIG. 5B is a cross-sectional view of the conductive fence of FIG. 5A subjected to a compression.

FIG. 4 is a top view of a conductive fence according to another embodiment of the present invention, FIG. 5A is a cross-sectional view of the conductive fence along line I-I in FIG. 4, and FIG. 5B is a cross-sectional view of the conductive fence of FIG. 5A subjected to a compression. Referring to FIGS. 4, 5A and 5B, differently from the conductive fence 130 in FIG. 3, the conductive fence 130' herein is an elastic metal component having a cross-section in Z shape. The deformation of the conductive fence 130' after a compression is shown in FIG. 5B.

Figure 6:
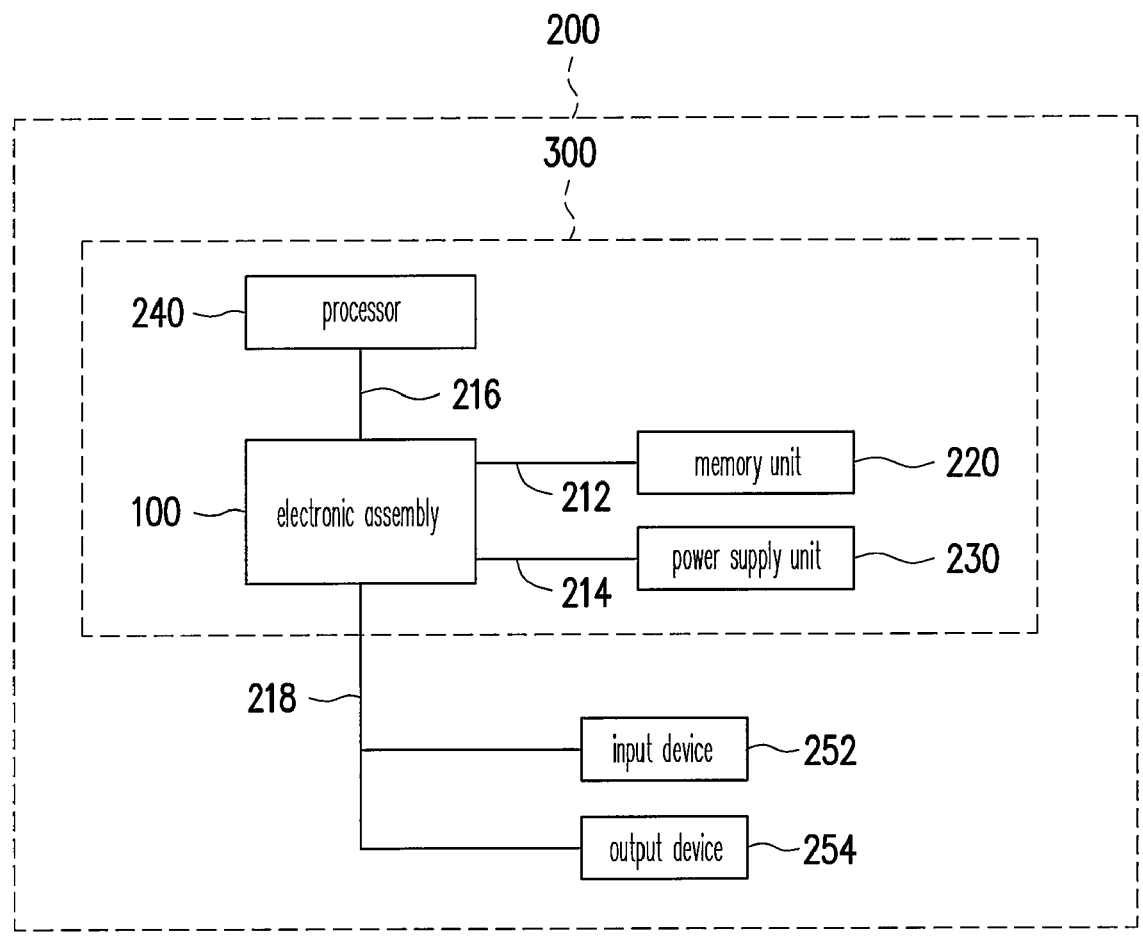
FIG. 6 is a block diagram showing an electronic system using the electronic assembly of FIG. 1.

FIG. 6 is a block diagram showing an electronic system using the electronic assembly of FIG. 1. Referring to FIG. 6, the electronic system 200 may be a computer system or a communication system; in more detail, the electronic system 200 may be a personal computer (PC) or a portable electronic apparatus, wherein the portable electronic apparatus is, for example, a notebook PC or a mobile phone.

The electronic system 200 is disposed on a circuit board 300. The electronic system 200 includes a plurality of bus 212, 214, 216, 218, a memory unit 220 and the electronic assembly 100 in FIG. 1. The memory unit 220 is electrically connected to the electronic assembly 100 via a bus 212. Besides, the electronic system 200 may further include a power supply unit 230 which is electrically connected to the electronic assembly 100 via a bus 214. The electronic system 200 may further include a processor 240 which is electrically connected to the electronic assembly 100 via a bus 216. In addition, the electronic system 200 may include an input device 252 and an output device 254, both of which are electrically connected to the electronic assembly 100 via a bus 218 served as the transmission interfaces between the electronic system 200 and a user or other devices.

In another embodiment (not shown), the electronic system 200 includes a plurality of bus 212, 214, 216, 218, a memory unit 220 and the electronic assembly 100 of FIG. 1, wherein the chip 120 of the electronic assembly 100 in FIG. 1 may be a processor.

In summary from above-described, since the present invention disposes a conductive fence between the substrate and the heat sink to make the conductive fence and the heat sink function also as the shields of the chip to reduce any adverse influence of an ESD current on the chip. Furthermore, the heat conductivity of the conductive fence, if considered by design, the conductive fence can further provide an additional heat-conducting passage between the substrate and the heat sink for advancing the dissipation efficiency. Moreover, the elasticity of the conductive fence, if considered by design, the conductive fence can buffer the pressure of the heat sink on the chip for protecting the chip in terms of structure thereof.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A cooling module, suitable for being fixed on an electronic package, wherein the electronic package has a substrate with a bonding surface and a chip bonded to the bonding surface; the cooling module comprising:
   a heat sink; and
   a conductive fence directly connected to the heat sink and the bonding surface of the substrate, wherein when the heat sink is disposed over the substrate and contacts the chip, the conductive fence at least locally surrounds the sides of the chip, and a material of the conductive fence is non-woven cloth plated with metal on surfaces thereof or an metal component having a cross-section in Z shape in a plane lateral to the bonding surface.

2. The cooling module as recited in claim 1, wherein the compressive deformation rate of the conductive fence in the direction vertical to the bonding surface ranges 5%-15%.

3. The cooling module as recited in claim 1, wherein the conductive fence intermittently surrounds the sides of the chip.

4. The cooling module as recited in claim 1, wherein the conductive fence continuously surrounds the sides of the chip.

5. The cooling module as recited in claim 1, wherein the heat sink is formed as a unit with the conductive fence.

6. An electronic package, comprising:
   a substrate, having a bonding surface;
   a chip, bonded to the bonding surface; and
   a conductive fence, directly connected to a heat sink and the bonding surface of the substrate, at least locally surrounding the sides of the chip, wherein a material of the conductive fence is non-woven cloth plated with metal on surfaces thereof.

7. The electronic package as recited in claim 6, wherein the chip is bonded to the bonding surface in flip chip bonding.

8. The electronic package as recited in claim 6, wherein the conductive fence intermittently surrounds the sides of the chip.

9. The electronic package as recited in claim 6, wherein the conductive fence continuously surrounds the sides of the chip.

10. The electronic package as recited in claim 6, wherein the substrate further has a grounding circuit and the conductive fence is further electrically connected to the grounding circuit.

11. The electronic package as recited in claim 10, wherein the grounding circuit is a grounding plane.

12. The electronic package as recited in claim 10, wherein the substrate has a grounding trace, the grounding trace is located on the bonding surface and continuously or intermittently surrounds the sides of the chip, the grounding trace is electrically connected to the grounding circuit, and the conductive fence is electrically connected to the grounding trace.

13. The electronic package as recited in claim 6, wherein the compressive deformation rate of the conductive fence in the direction vertical to the bonding surface ranges 5%-15%.

14. An electronic assembly, comprising:
   a substrate, having a bonding surface;
   a chip, bonded to the bonding surface; and
   a conductive fence, directly connected to a heat sink and the bonding surface of the substrate, at least locally surrounding the sides of the chip, wherein the conductive fence has a cross-section in Z shape in a plane lateral to the bonding surface;
   the heat sink, disposed over the substrate and contacting the chip and the conductive fence.

15. The electronic assembly as recited in claim 14, wherein the chip is bonded to the bonding surface in flip chip bonding.

16. The electronic assembly as recited in claim 14, wherein the conductive fence intermittently surrounds the sides of the chip.

17. The electronic assembly as recited in claim 14, wherein the conductive fence continuously surrounds the sides of the chip.

18. The electronic assembly as recited in claim 14, wherein the substrate further has a grounding circuit and the conductive fence is further electrically connected to the grounding circuit.

19. The electronic assembly as recited in claim 18, wherein the grounding circuit is a grounding plane.

20. The electronic assembly as recited in claim 18, wherein the substrate has a grounding trace, the grounding trace is located on the bonding surface and continuously or intermittently surrounds the sides of the chip, the grounding trace is electrically connected to the grounding circuit and the conductive fence is electrically connected to the grounding trace.

21. The electronic assembly as recited in claim 14, wherein the compressive deformation rate of the conductive fence in the direction vertical to the bonding surface ranges 5%-15%.

22. The electronic assembly as recited in claim 14, wherein the heat sink is formed as a unit with the conductive fence.

* * * * *